(12) United States Patent
Caplet et al.

(10) Patent No.: US 9,309,110 B2
(45) Date of Patent: Apr. 12, 2016

(54) METHOD OF ENCAPSULATING A MICROELECTRONIC DEVICE BY A GETTER MATERIAL

(75) Inventors: Stephane Caplet, Sassenage (FR); Xavier Baillin, Crolles (FR); Jean-Louis Pornin, Crolles (FR)

(73) Assignee: Commissariat A L'Energie Atomique, Paris (FR)

( * ) Notice: Subject to any disclaimer, the term of this patent is extended or adjusted under 35 U.S.C. 154(b) by 393 days.

(21) Appl. No.: 12/494,123

(22) Filed: Jun. 29, 2009

(65) Prior Publication Data

US 2010/0003789 A1 Jan. 7, 2010

(30) Foreign Application Priority Data

Jul. 1, 2008 (FR) ...................................... 08 54449

(51) Int. Cl.
*H01L 21/00* (2006.01)
*B81C 1/00* (2006.01)

(52) U.S. Cl.
CPC ..... *B81C 1/00285* (2013.01); *B81C 2203/0136* (2013.01); *B81C 2203/0145* (2013.01)

(58) Field of Classification Search
USPC ................................... 438/55, 106, 115, 127
See application file for complete search history.

(56) References Cited

U.S. PATENT DOCUMENTS

| 5,688,708 | A | * | 11/1997 | Kato et al. ....................... 445/25 |
| 6,923,625 | B2 | | 8/2005 | Sparks |
| 7,595,209 | B1 | * | 9/2009 | Monadgemi et al. ........... 438/51 |
| 2002/0175284 | A1 | | 11/2002 | Vilain |
| 2003/0153116 | A1 | | 8/2003 | Carley et al. |
| 2008/0049386 | A1 | | 2/2008 | Pornin et al. |

FOREIGN PATENT DOCUMENTS

| JP | 2000-124470 | 4/2000 |
| JP | 2005-197151 | 7/2005 |
| JP | 2005-305607 | 11/2005 |
| JP | 2006-518672 | 8/2006 |
| JP | 2007-160492 | 6/2007 |

(Continued)

OTHER PUBLICATIONS

Gillot, C. et al., "Wafer Level Thin Film Encapsulation for MEMS", 2005 Electronics Packaging Technology Conference, pp. 243-247, 2005.
French Preliminary Search Report for French application No. 08 54449 dated Mar. 31, 2009.

(Continued)

*Primary Examiner* — Mamadou Diallo
*Assistant Examiner* — Jay C Chang
(74) *Attorney, Agent, or Firm* — Nixon Peabody LLP; Robert E. Krebs

(57) ABSTRACT

A method of encapsulating a microelectronic device arranged on a substrate, comprising at least the following steps: a) formation of a portion of sacrificial material covering at least one part of the microelectronic device, the volume of which occupies a space intended to form at least one part of a cavity in which the device is intended to be encapsulated; b) deposition of a layer based on at least one getter material, covering at least one part of the portion of sacrificial material; c) formation of at least one orifice through at least the layer of getter material, forming an access to the portion of sacrificial material; d) elimination of the portion of sacrificial material via the orifice, forming the cavity in which the microelectronic device is encapsulated; and e) sealing of the cavity.

26 Claims, 4 Drawing Sheets

(56) References Cited

FOREIGN PATENT DOCUMENTS

| | | |
|---|---|---|
| JP | 2008-72091 | 3/2008 |
| WO | 2004/061983 | 7/2004 |

OTHER PUBLICATIONS

Office Action in Japanese Application No. 2009-155859, mailed Jun. 25, 2013.

* cited by examiner

METHOD OF ENCAPSULATING A MICROELECTRONIC DEVICE BY A GETTER MATERIAL

CROSS REFERENCE TO RELATED APPLICATIONS or PRIORITY CLAIM

This application claims priority of French Patent Application No. 08 54449, filed Jul. 1, 2008.

DESCRIPTION

1. Technical Field

The invention relates to a method of encapsulating microelectronic devices by a getter material, enabling in particular the formation of a thin film packaging of a microelectronic device in a cavity under vacuum or under controlled atmosphere.

2. State of the Prior Art

A getter material is a material comprising, in an intrinsic manner and/or by virtue of its microscopic morphology, absorbent and/or adsorbent properties vis-à-vis gaseous molecules, which can thus form a chemical gas pump when it is arranged in a closed environment. This type of material may also be used in numerous microelectronic applications such as vacuum tubes, field effect systems or instead MEMS (micro electromechanical systems) or NEMS (nano electromechanical systems), to form an environment under high vacuum or under controlled atmosphere (control of the gas and/or the pressure). In the case of encapsulated MEMS or NEMS, an environment under high vacuum formed around the device makes it possible for example to obtain an improved operation of resonating mechanical systems, but also optical systems sensitive to the absorption of light radiation by the surrounding gases, or for reasons of thermal insulation for example in the case of bolometers.

Non evaporable getter materials are for example metals such as titanium, zirconium, hafnium, vanadium or instead metal alloys of these four metals or other suitable metals. Such a non evaporable getter material is generally deposited directly on a wall of the enclosure in which it is desired to form a chemical pump in the form of a thin film. This material is then thermally activated by heating it. Document U.S. Pat. No. 6,923,625 B2 discloses the formation of such a thin film getter material on a substrate. Nevertheless, such a method then makes it necessary to carry out an assembly of the substrate comprising the layer of getter material with the substrate on which is formed the device intended to be confined in the enclosure, which can be a major drawback.

The getter material may also be deposited in the cavity where the microelectronic device is located, for example on the substrate, beside the device. The cavity is then re-sealed by thin films forming a cover. Document FR 2 822 541 A discloses such a method. Such a method has in particular the drawback that the surface area of the getter material is limited by the presence of the device on the substrate. In addition, the getter material is here co-incorporated in the device, which limits the technologies that can be used to form the getter material and the device: for example, incompatibility of implementation of a hot process or an aggressive chemistry in relation to the getter material for the formation of the microelectronic device.

DESCRIPTION OF THE INVENTION

Thus there is a need to propose a method of encapsulating a microelectronic device that makes it possible to obtain a large absorption surface area of getter material, not requiring the assembly together of substrates and which does not pose a problem of technological compatibility between the techniques of forming the getter material and the microelectronic device.

To do this, one embodiment proposes a method of encapsulating a microelectronic device arranged on a substrate, comprising at least the following steps:

a) formation of a portion of sacrificial material covering at least one part, or the totality, of the microelectronic device, the volume of which occupies a space intended to form at least one part of a cavity in which the device is intended to be encapsulated, b) deposition of a layer based on at least one getter material, covering at least one part, or the totality, of the portion of sacrificial material, c) formation of at least one orifice through at least the layer of getter material, forming an access to the portion of sacrificial material, d) elimination, for example by etching, of the portion of sacrificial material via the orifice, forming the cavity in which the microelectronic device is encapsulated, e) sealing of the cavity, for example by a deposition of a material obstructing at least the orifice.

Thus, a layer of getter material is incorporated, the rear face of the deposition of which is bared, in the cavity encapsulating the microelectronic device. The use of a layer of getter material deposited above the microelectronic device makes it possible to obtain a larger surface area of getter material present in the cavity compared to methods of the prior art.

All of the necessary surface area in the cavity may thus be used for the getter effect. In addition, the getter material is incorporated in post-process packaging, in other words after the formation of the microelectronic device, which gives more latitude to the techniques that can be used to form the microelectronic device (examples: hot process, aggressive chemistry in relation to the getter material, etc.), and does so without necessitating an assembly of two different substrates to form the cavity.

In addition, with this method, it is the rear face of the layer of getter material that fulfils the function of gaseous absorption, unlike encapsulation methods of the prior art in which it is uniquely the front face of the layer of getter material that fulfils the gaseous absorption function.

According to one embodiment of the invention, a microelectronic device encapsulated in a sealed cavity comprising an incorporated getter material is thereby obtained, the lower face of which is arranged facing the microelectronic device. A stack of superimposed layers is formed, for example thin films, forming the cover of the cavity and comprising the getter material. The microelectronic device may be a mechanically and/or electrically active element, such as a MEMS, NEMS, MOEMS (micro opto-electromechanical systems), an optical sensor (particularly an infrared optical sensor), an emission structure, an accelerometer, a gyrometer or other.

This method thus makes it possible to encapsulate a microelectronic device in a high vacuum environment, enabling for example an improved operation of the microelectronic device when it is a resonating mechanical microsystem, or under controlled pressure of a gas, for example nitrogen, enabling for example an improved operation of the microelectronic device when it is for example an optical microsystem sensitive to the thermal conduction of the residual gases.

Step a) of formation of the portion of sacrificial material may comprise at least the implementation of the following steps:

a1) deposition of a layer based on sacrificial material on the substrate and covering at least the microelectronic device, a2) formatting of a part of the sacrificial layer, a remaining portion of the sacrificial layer being able to form said portion of sacrificial material.

This formatting may be obtained, when the sacrificial layer is based on a photosensitive material (for example a resin, a polymer, etc.), by photolithography and development. When the sacrificial layer is based on a non photosensitive material (for example Cu, Al, etc.), this formatting may be obtained by etching of the sacrificial layer according to patterns defined beforehand by a mask.

The method may further comprise, between step a) of formation of the portion of sacrificial material and step b) of deposition of the layer of getter material, a step of thermal flow of the portion of sacrificial material. Such a thermal flow makes it possible to "soften" the angles of this portion of sacrificial material and thus to obtain better step passages at the angles of this sacrificial portion, thus improving the covering of the layer(s) deposited subsequently on the portion of sacrificial material and also improving the hermeticity and the solidity of the cavity formed.

The method may further comprise, between step a) of formation of the portion of sacrificial material and step b) of deposition of the layer of getter material, a step of deposition of a protective layer on the portion of sacrificial material, the layer of getter material being deposited, during step b), on the protective layer, the orifice being moreover formed, during step c), through the protective layer.

According to one embodiment, at least one part of the protective layer may be etched or not during step d). In one embodiment wherein a second cavity is formed above the layer of getter material, this protective layer may be conserved. On the other hand, in another embodiment only forming a single cavity, this protective layer is at least partially eliminated. This protective layer may make it possible not to damage the getter material during the etching of the sacrificial material.

The method may further comprise, between step b) of deposition of the layer of getter material and step c) of formation of the orifice, a step of deposition of a hermeticity layer on the layer of getter material, the orifice being able moreover to be formed, during step c), through the hermeticity layer. Such a hermeticity layer makes it possible to improve the hermeticity of the cavity in which is encapsulated the microelectronic device.

The method may further comprise, between step b) of deposition of the layer of getter material and the step of deposition of the hermeticity layer, a step of etching a part of the layer of getter material, a remaining portion of the layer of getter material partially covering the portion of sacrificial material. Thus, the getter material is structured in a localised manner, enabling the formation of an optical window facing the microelectronic device when this is an optical device.

The hermeticity layer may have a thickness between around 500 nm and 10 µm, and/or be based on titanium and/or chromium and/or copper and/or at least one metal and/or based on a material transparent to a range of operating wavelengths of the microelectronic device.

The method may further comprise, between step b) of deposition of the layer of getter material and step c) of formation of the orifice, a step of etching a part of the layer or layers formed on the portion of sacrificial material, the remaining portions of said deposited layer(s) being able to form a cover or a part of a cover covering the portion of sacrificial material.

Step e) of sealing may comprise the deposition of a layer of a material and/or the formation of at least one plug, obstructing the orifice on the getter material or on the hermeticity layer.

The material and/or the plug obstructing the orifice may be based on a metal and/or an oxide and/or a getter material.

The method may further comprise, during step a) of formation of the portion of sacrificial material, the formation, for example by an etching, of at least one second orifice in the portion of sacrificial material, the layers deposited during subsequent steps also being able to be deposited in said second orifice, being able to form at least a micro-pillar in the cavity, thus improving the solidity of the cavity in which is encapsulated the microelectronic device.

The portion of sacrificial material may have a thickness between around 1 µm and 20 µm, and/or the sacrificial material may be based on photosensitive resin or at least one metal.

The layer of getter material may have a thickness between around 200 nm and 5 µm, and/or the getter material may be based on titanium and/or zirconium and/or hafnium and/or vanadium.

The method may further comprise, after step e) of sealing of the cavity, a step of thermal activation of the getter material.

In another embodiment, the method may further comprise, between step c) of formation of the orifice and step d) of elimination, or between step d) of elimination and step e) of sealing, the following steps:

formation of a second portion of sacrificial material on the layer of getter material or on the hermeticity layer, the volume of which occupies a space intended to form at least one part of a second cavity, deposition of a second layer based on at least one getter material and/or a hermeticity layer covering at least one part of the second portion of sacrificial material, formation of at least one second orifice through at least the second layer of getter material and/or the hermeticity layer, forming an access to the second portion of sacrificial material, and further comprising, between the step of formation of the second orifice and step d) of elimination, or during step d) of elimination, or between step d) of elimination and step e) of sealing, a step of elimination of at least the second portion of sacrificial material via the second orifice, forming the second cavity.

In this embodiment, the second cavity is in communication with the other cavity in which is arranged the microelectronic device. In this embodiment, the front face and/or the rear face of the getter layer may thus assure a gaseous absorption function, thus making it possible to further increase the active surface area of the getter material.

The formation of the second portion of sacrificial material may comprise at least the implementation of the following steps:

deposition of a second layer based on sacrificial material on the layer of getter material or on the hermeticity layer, at at least one part of the microelectronic device, formatting of one part of the second sacrificial layer, a remaining portion of the second sacrificial layer forming said second portion of sacrificial material.

The method may further comprise, before the step of deposition of the second layer of getter material and/or the hermeticity layer, the implementation of a step of thermal flow of the second portion of sacrificial material.

The method may further comprise, between the step of formation of the second portion of sacrificial material and the step of deposition of the second layer of getter material and/or the hermeticity layer, a step of deposition of a second protective layer on the second portion of sacrificial material, the second layer of getter material and/or the hermeticity layer then being deposited on the second protective layer, the second orifice being moreover formed through the second protective layer.

The protective layer and/or the second protective layer may for example each have a thickness between around 10 nm and 1 μm and/or be based on chromium and/or copper.

The method may further comprise, between the step of deposition of the second layer of getter material and/or the hermeticity layer and the step of formation of the second orifice, a step of etching a part of the layer or layers formed on the second portion of sacrificial material, the remaining portions of said deposited layer(s) forming a cover or a part of a cover covering the second portion of sacrificial material.

The portion of sacrificial material and/or the second portion of sacrificial material may each have a thickness between around 1 μm and 20 μm, and/or the sacrificial material may be based on photosensitive resin or at least one metal.

The layer of getter material and/or the second layer of getter material may each have a thickness between around 200 nm and 5 μm, and/or the getter material may be based on titanium and/or zirconium and/or hafnium and/or vanadium.

Step e) of sealing may comprise the deposition of a layer of a material and/or the formation of at least one plug, obstructing the second orifice on the second layer of getter material and/or on the hermeticity layer.

BRIEF DESCRIPTION OF DRAWINGS

The present invention will be better understood on reading the description of embodiments, given purely by way of indication and in no way limiting, and by referring to the appended figures in which.

Identical, similar or equivalent parts of the different figures described hereafter bear the same number references so as to make it easier to go from one figure to the next.

In order to make the figures easier to read, the different parts represented in the figures are not necessarily to the same scale.

The different possibilities (alternatives and embodiments) should be understood as not been mutually exclusive and may be combined together.

DETAILED DESCRIPTION OF SPECIFIC EMBODIMENTS

Reference is firstly made to FIGS. 1A to 1E, which represent the steps of a method of encapsulating a microelectronic device 100 according to a first embodiment. In this first embodiment, the microelectronic device 100 is a MEMS.

Figure 1A:
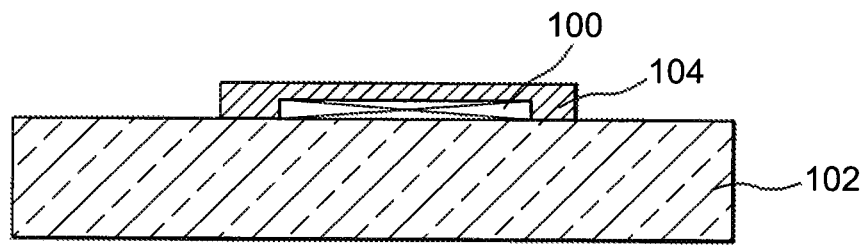
FIGS. 1A to 1E represent the steps of a method of encapsulating a microelectronic device, object of the present invention, according to a first embodiment.

In FIG. 1A, firstly the deposition is carried out of a layer based on a sacrificial material on the microelectronic device 100, previously formed on a substrate 102 for example based on semi-conductor such as silicon or glass. In this first embodiment, the sacrificial material is based on photosensitive resin. Nevertheless, this sacrificial layer may be based on any material that can be selectively eliminated compared to other materials present during the subsequent elimination of this sacrificial material (represented in FIG. 1D), for example a metal such as copper. The thickness of the sacrificial layer may be several micrometers, for example between around 1 μm and 20 μm. The thickness of the sacrificial layer is in particular chosen as a function of the requisite height of the cavity in which the microelectronic device 100 is intended to be encapsulated.

This sacrificial layer is then structured, for example by exposure when the sacrificial layer is based on photosensitive resin, or lithography when the sacrificial layer is based on a metal, and etching. This structuring enables a remaining portion 104 of the sacrificial layer covering the microelectronic device 100 to form a "mould" for the future cavity in which the microelectronic device 100 is intended to be encapsulated.

After this structuring, and when the sacrificial layer is based on resin, it is possible to carry out a thermal flow of this portion of sacrificial material 104 in order to obtain better step passages at the angles formed by this portion of sacrificial material 104. This thermal flow may be carried out in an oven, at a temperature between around 250° C. and 350° C.

Figure 1B:
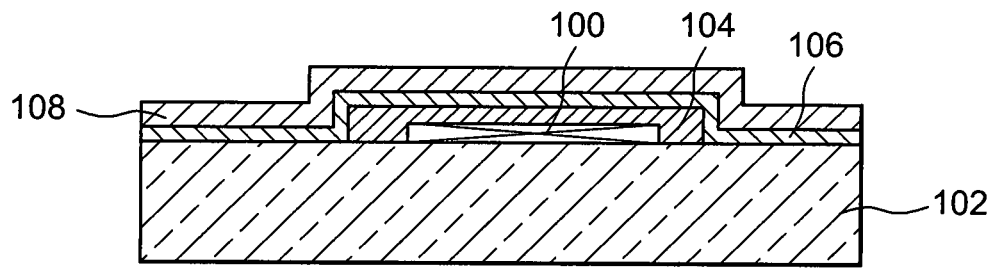

In FIG. 1B, the deposition of a protective layer 106 is then carried out, then the deposition of a layer 108 based on getter material, on the substrate 102 and on the portion 104 of sacrificial material. The purpose of the protective layer 106 is in particular to protect the layer of getter material 108 when the etching of the portion of sacrificial material 104 is carried out at a later stage. Nevertheless, in an alternative of this first embodiment, it is possible not to deposit any protective layer 106, and thus to deposit directly the layer of getter material 108 on the substrate 102 and on the portion of sacrificial material 104. This protective layer 106 may in particular be omitted when the sacrificial material may be eliminated without damaging the layer of getter material 108.

The protective layer 106 is for example based on chromium and has a thickness that may be between around 10 nm and 1 μm. The protective layer 106 may be deposited by PVD (physical vapour deposition) and for example by sputtering. In the case where this protective layer 106 is then eliminated on all or part of the layer of getter material 108, this layer 106 may be based on any material that can be etched without damaging the microelectronic device 100 and while preserving a layer of getter material of sufficient thickness (for example greater than around 200 nm) in the case where it is partially etched. If the material of the protective layer 106 entails being etched by a wet etching, the microelectronic device 100 must also be compatible with the implementation, after the etching of the protective layer 106, of a drying step, in other words it must have a sufficient mechanical strength compared to the capillarity forces induced by this drying step. It will in this case be possible to form a protective layer 106 for example based on copper.

It is possible, during the remainder of the method, that the protective layer 106 is not eliminated after the removal of the sacrificial layer. Indeed, when the layer of getter material 108 comprises titanium and/or the protective layer 106 comprises copper and/or chromium and/or niobium, and/or the protective layer 106 has a thickness between several nanometers and several tens of nanometers (for example between 1 nm and 100 nm or between 1 nm and 50 nm), this protective layer 106 may be conserved because the getter material may interact, through such a protective layer 106, with the medium present in the cavity. In an alternative, the protective layer 106 may be partly eliminated so that it has at the most a critical thickness beyond which the getter material no longer interacts through the protective layer 106. In all cases, the protective layer 106 may be formed by a single layer or by a stack of several layers in particular when it is partially eliminated.

The layer of getter material 108 may be based on any getter material, for example titanium and/or zirconium and/or hafnium, and/or aluminium and/or barium and/or cerium and/or chromium and/or cobalt and/or iron and/or magnesium and/or manganese and/or molybdenum and/or niobium and/or tantalum and/or thallium and/or vanadium and/or tungsten and/or any other material that can have gaseous absorption properties. This layer of getter material 108 may have a thickness between around 200 nm and 5 µm.

These two depositions are carried out preferably in the same vacuum cycle, in other words the structure on which are deposited the layers 106 and 108 is not returned to the free atmosphere and remains under vacuum in the deposition machine between these two deposition steps in order to avoid the presence of polluting particles at the interface of the two layers 106 and 108. In this way a very good quality is assured of the face of the layer of getter material 108 placed in contact with the protective layer 106 and intended to form a wall of the cavity in which the microelectronic device 100 will be encapsulated.

A hermeticity layer 110 is then deposited on the layer of getter material 108. This hermeticity layer 110 is for example based on titanium, chromium or instead copper, or instead based on a metal material, and may have a thickness between around 500 nm and 10 µm.

When the microelectronic device 100 is an optical device (MOEMS, optical sensor, display device, etc.), the material of the hermeticity layer 110 may be transparent or at least partially transparent to the operating wavelengths of the microelectronic device 100. The hermeticity layer 110 is for example in this case an oxide deposited by PECVD (plasma enhanced chemical vapour deposition) or $Al_2O_3$ deposited by ALD (atomic layer deposition), the thickness of this hermeticity layer 110 then being adapted as a function of the level of hermeticity and transparency required for the microelectronic device 100.

The three layers 106, 108 and 110 are then structured for example by lithography and etching in order to form the structure of the protective cover intended to encapsulate the microelectronic device 100.

Figure 1C:
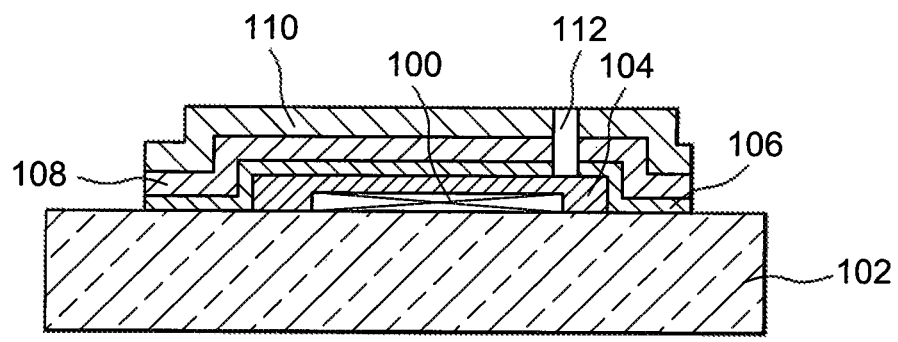

Finally, orifices 112 are formed through these three layers 106, 108 and 110 in order to form an access to the sacrificial layer 104. In FIG. 1C, a single orifice 112 is represented. These orifices 112 may be spread out above the sacrificial material 104 or moved beside the portion of sacrificial material 104 if this is accessible by the side. Preferably, the steps of forming orifices 112 and the structuring of layers 106, 108 and 110 will be implemented simultaneously.

Figure 1D:
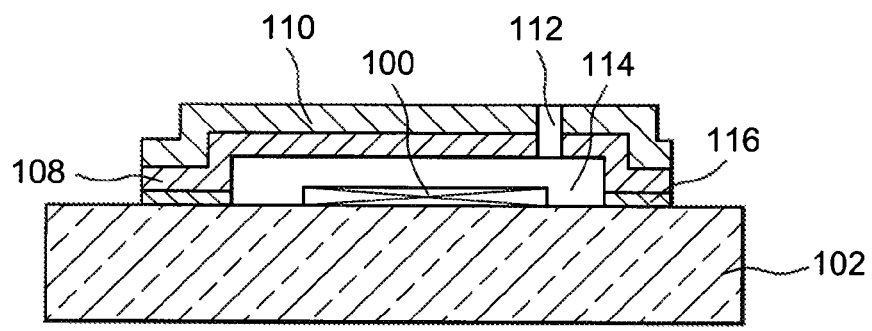

The portion of sacrificial material 104 is then etched in order to form a cavity 114 in which is encapsulated the microelectronic device 100 (FIG. 1D). The parts of the protective layer 106 located at the cavity 114 are also etched, for example by a dry etching by ozone plasma when the protective layer 106 is based on chromium or by a wet etching from a solution of $FeCl_3$ when the protective layer 106 is based on copper. In FIG. 1D, remaining portions 116 of this protective layer 106 form a part of the lateral walls of the cavity 114.

Thus, the rear face of the layer of getter material 108, in other words the face that was previously in contact with the protective layer 106, is bared, forming in particular a principal upper wall of the cavity 114. The absorption of gas in the cavity 114 may thus be achieved by this rear face of the layer of getter material 108.

Figure 1E:
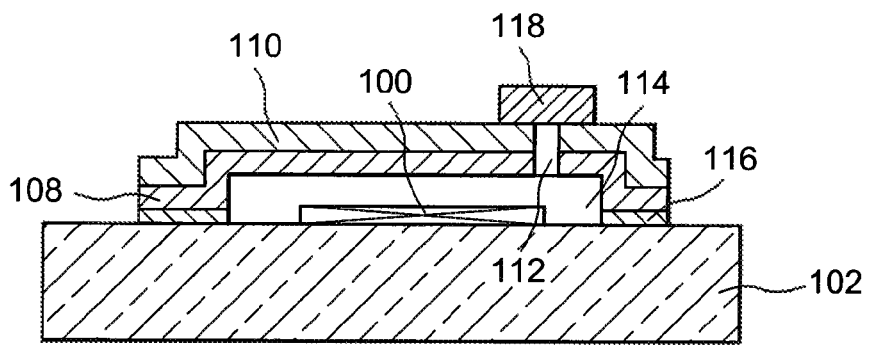

Finally, plugs 118 are formed on the hermeticity layer 110 in order to plug the orifices 112 and thus hermetically seal the cavity 114. In FIG. 1E, only one plug 118 is represented. If it is wished to have a high vacuum, for example a pressure less than around 1 mbar in the cavity 114, the plug 118 will be preferably formed by a metal deposition by vacuum evaporation so that at the moment of the plugging a vacuum is already present in the cavity 114. In an alternative, the plugs 118 may be based on a getter material, thus contributing to gaseous absorption in the cavity 114. If it is desired that the atmosphere of the cavity 114 is exempt of reactive gas such as $O_2$, the plugs 118 may be formed by a deposition by argon sputtering (residual argon not being a handicap in this case). Finally, it is also possible to form the plugs 118 by a deposition of oxide by PECVD.

In an alternative of this method, it is possible not to deposit a hermeticity layer 110 on the layer of getter material 108. In this case, the protective cover of the device 100 may only be formed by the layer of getter material 108 and if necessary residual portions 116 of the protective layer 106. In this alternative, it is then possible that the plugs 118 are formed by a layer covering the whole of the layer of getter material 108, and thus fulfilling the same role of cover as the hermeticity layer 110.

Once the cavity is hermetically sealed, a thermal activation of the getter material 108 is then carried out so that it achieves an absorption of the gaseous molecules located in the cavity 114. This thermal activation may be carried out by exposing the getter material to a temperature between around 250° C. and 450° C.

Figure 2:
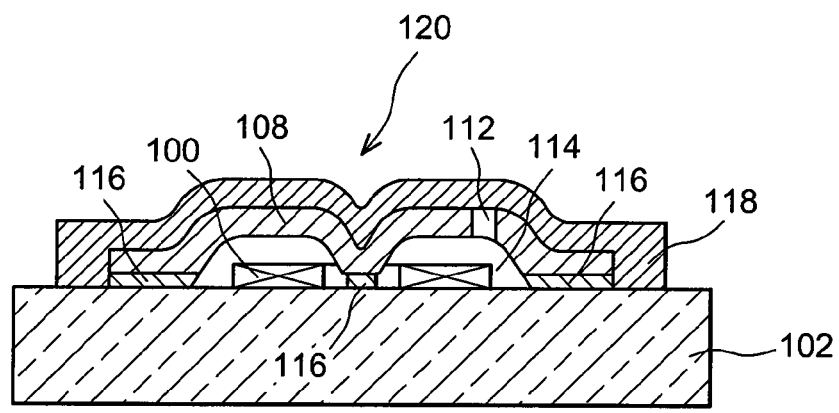
FIG. 2 represents a microelectronic device encapsulated according to one method, object of the present invention, according to an alternative of the first embodiment.

In an embodiment alternative, the layers deposited to encapsulate the microelectronic device 100 can form support micro-pillars in the cavity 114, judiciously spread out in the cavity 114, mechanically consolidating the cover encapsulating the device 100. FIG. 2 represents an example of device 100 encapsulated in a cavity 114 in which are formed micro-pillars 120. In this FIG. 2, a single micro-pillar 120 is represented. These micro-pillars 120 are obtained by structuring the portion of sacrificial material 104 (in other words by forming orifices in this portion of sacrificial material 104) so that portions of the layer of getter material 108 and, when these are present, portions 116 of the protective layer 106 and/or portions of the hermeticity layer 110 and/or portions of a layer 118 forming the plugs form the micro-pillars 120 arranged in the cavity 114.

In the example of FIG. 2, the encapsulation of the device 100 is carried out without the hermeticity layer 110, and the plugging of the orifice 112 is achieved by a layer 118 covering the whole of the layer of getter material 108.

Figure 3A:
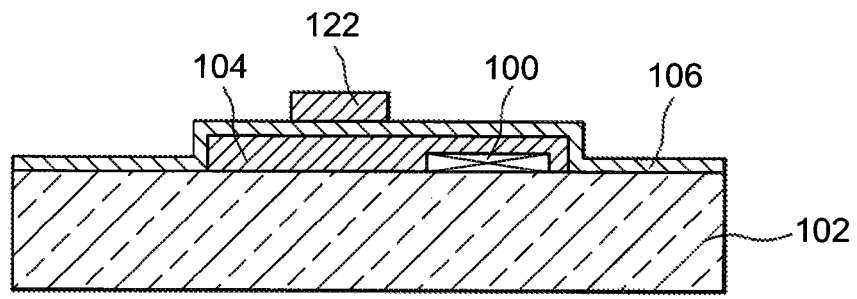
FIGS. 3A to 3C represent the steps of a method of encapsulating a microelectronic device, object of the present invention, according to a second embodiment.
Figure 3B:
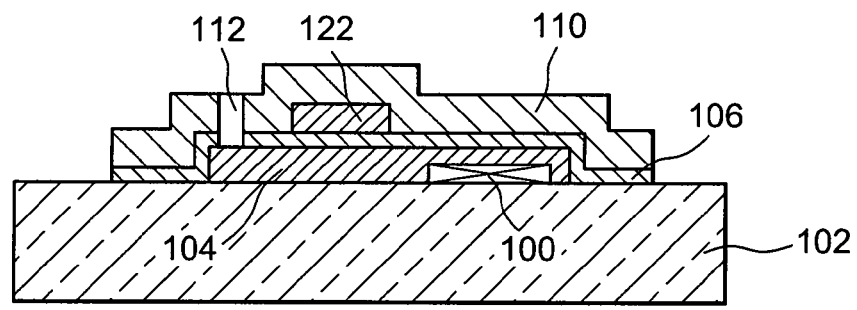
Figure 3C:
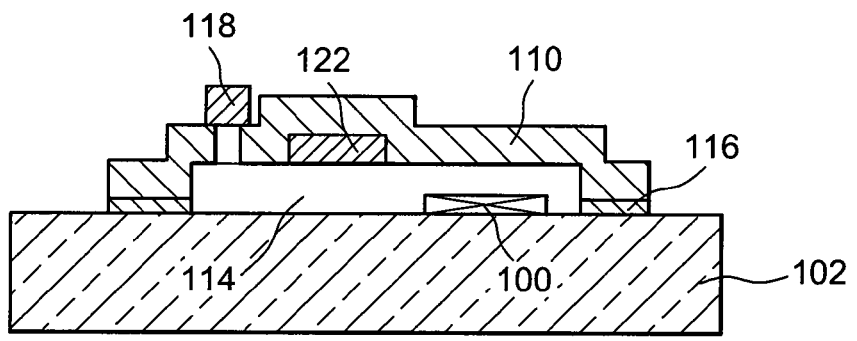

Reference will now be made to FIGS. 3A to 3C, which represent the steps of a method of encapsulating a microelectronic device 100 according to a second embodiment.

Firstly the same steps as those described previously with reference to FIGS. 1A and 1B are carried out, in other words the deposition of a sacrificial layer on a microelectronic device 100 formed on a substrate 102, the structuring of the sacrificial layer to obtain a portion 104 of sacrificial material, then the deposition of a protective layer 106 on the portion of sacrificial material 104 and the deposition of a layer of getter material 108 on the protective layer 106. As represented in FIG. 3A, a structuring of the layer of getter material 108 is then carried out in order to conserve one or several portions 122 of this layer 108 only partially covering the protective layer 106. Once again, in an embodiment alternative, it is possible not to deposit the protective layer 106 and to deposit directly the layer of getter material 108 on the portion of sacrificial material 104. In the example of FIG. 3A, a single portion 122 of getter material is conserved. The dimensions and the shape of the portion 122 of getter material are chosen as a function of the quantity of gas to be absorbed in the cavity 114: the higher the vacuum required in the cavity 114, the more this portion 122 will have large dimensions.

As represented in FIG. 3B, the deposition of the hermeticity layer 110 on the protective layer 106 as well as on the portion 122 of getter material is then carried out. A structuring by lithography and etching of the hermeticity layer 110 and the protective layer 106 then makes it possible to delimit the cover of the device 100. Openings 112 are also formed through the hermeticity 110 and protection 106 layers in order to form accesses to the sacrificial layer 104. Given that only a portion 122 of getter material is used in this second embodiment, preferably the openings 112 are formed such that they do not extend through the portion 122.

The portions of the protective layer 106 located at the future cavity 114 are then etched, as well as the portion of sacrificial material 104, thereby forming the cavity 114. Finally, as in the first embodiment, the orifices 112 are then plugged by plugs 118 formed on the hermeticity layer 110 (FIG. 3C).

Compared to the first embodiment, this second embodiment makes it possible, for example when the microelectronic device 100 is an optical device, to avoid the getter material being in the optical field of the device 100. Thus, by choosing a hermeticity layer 110 based on a material transparent or partially transparent to the operating wavelengths of the device 100, a microelectronic device 100 incorporated under vacuum and comprising an optical window enabling it to emit and/or receive an optical radiation is thus obtained.

The alternatives described previously with reference to the first embodiment (presence or not of the protective layer 106, presence or not of the hermeticity layer 110, plugging of the orifices 112 by a layer covering the whole of the cover, formation of micro-pillars 120 in the cavity 114) may also apply to this second embodiment.

Figure 4:
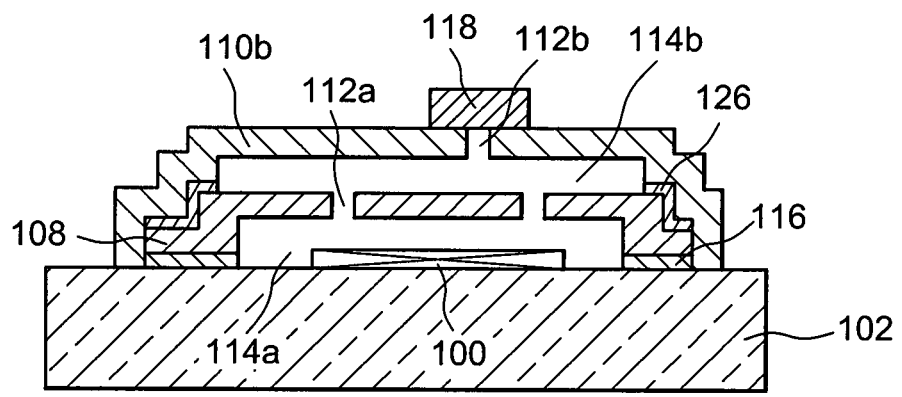
FIG. 4 represents a microelectronic device encapsulated according to one method, object of the present invention, according to a third embodiment.

Reference is made to FIG. 4, which represents a microelectronic device 100 encapsulated according to an encapsulation method, according to a third embodiment.

In this third embodiment, several cavities are formed, for example stacked one on top of the other. In the example of FIG. 4, the device 100 is encapsulated in a first cavity 114a, above which is formed a second cavity 114b, these two cavities 114a, 114b communicating by means of one or several orifices 112a or structurings formed in the layer of getter material 108.

To form this type of encapsulation, the previous steps described in reference to FIGS. 1A to 1C are firstly implemented: deposition and structuring of a sacrificial layer on the microelectronic device 100 to form a portion of sacrificial material, then the deposition of a protective layer and a layer of getter material 108 on the portion of sacrificial material. These layers are then structured so that they form one or several orifices 112a (the orifices may be of any shape) through the layer of getter material 108 and the protective layer, and thereby form an access to the portion of sacrificial material.

As in the preceding embodiments, when the sacrificial layer is based on resin, it is possible to carry out a thermal flow of this portion of sacrificial material before the deposition of the protective layer and/or the layer of getter material 108 on the portion of sacrificial material. In another alternative, it is also possible to deposit directly the layer of getter material 108 on the substrate 102 and on the portion of sacrificial material 104. Finally, the formation of the orifice(s) 112a is implemented preferably simultaneously to the structuring of the previously deposited layers.

A second sacrificial layer is then deposited on the layer of getter material 108, then a structuring of this second sacrificial layer is carried out to form a second portion of sacrificial material. This second portion of sacrificial material may be or not based on the same material(s) as the portion of sacrificial material formed previously. A second protective layer is then deposited on this second portion of sacrificial material, and finally a hermeticity layer 110 is deposited on the second protective layer. These layers are then structured for example by lithography and etching in order to form the remainder of the structure of the protective cover. One or several second orifices 112b are then formed through the hermeticity layer 110 and the second protective layer, thereby forming an access to the second portion of sacrificial material.

In an alternative, it is possible not to use the second protective layer and to deposit directly the hermeticity layer 110 on the second portion of sacrificial material. The formation of the second orifice(s) 112b is implemented preferably simultaneously to the structuring of the second protective layer and the hermeticity layer 110. The hermeticity layer 110 may also be replaced by a second layer of getter material in order to have a larger getter surface area in the second cavity 114b.

The first and the second portion of sacrificial material are then successively eliminated through the orifices 112b and 112a, as well as the parts of the protective layers located at the cavities 114a, 114b and thus form the two superimposed cavities 114a, 114b. Remaining portions 116 and 126 of the protective layers form a part of the lateral walls of cavities 114a, 114b. In an alternative, the first portion of sacrificial material may be eliminated before the deposition of the layers intended to form the cover of the second cavity 114b (second protective layer, second layer of getter material or hermeticity layer).

The second orifice(s) 112b are then plugged by one or several plugs 118, formed for example in a similar manner to the plugs formed in the preceding embodiments.

In this third embodiment, the layer of getter material 108 makes it possible to achieve a gaseous absorption in the two cavities 114a, 114b, each of the faces of the layer of getter material 108 achieving the absorption in the cavities 114a, 114b.

The layers used in this third embodiment are for example of similar nature and/or of similar dimensions to those described with reference to the preceding embodiments.

In an alternative of this third embodiment, it is possible to arrange a second microelectronic device in the second cavity 114b, by arranging it on the layer of getter material 108 before the deposition of the layers making it possible to form the second cavity 114b. In addition, the orifice(s) 112a formed in the getter layer 108 may be in greater number and/or have larger sections than those of the orifices 112b formed in the hermeticity layer 110 given that these orifices 112a are not intended to be plugged.

Generally speaking, the different alternatives described previously with reference to the first two embodiments also apply to this third embodiment (presence or not of protective layers, formation of micro-pillars in one or several cavities, plugs formed by a layer of material, etc.).

What is claimed:

1. A method of encapsulating a microelectronic device arranged on a substrate, comprising at least the following steps:

a) formation of a portion of sacrificial material covering at least one part of the microelectronic device, the volume of which occupies a space intended to form at least one part of a cavity in which the device is intended to be encapsulated, b) deposition of a getter material layer, a rear face of the getter material in the getter material layer covering at least one part of the portion of sacrificial material, c) formation of at least one orifice through at least a first cover comprising the getter material layer and a first hermeticity layer above the getter material layer, thereby forming an access to the portion of sacrificial material, d) elimination of the portion of sacrificial material via the orifice, thereby forming the cavity in which the microelectronic device is encapsulated and such that at least a portion of the rear face of the getter material is exposed in the cavity and said rear face of the getter material forms an entirety of a principal upper wall of the cavity, except for a portion occupied by the orifice, without an intervening material between the getter material layer and the cavity, and able to absorb gas in the cavity, and e) sealing of the cavity.

2. The method according to claim 1, wherein step a) of formation of the portion of sacrificial material comprises at least the implementation of the following steps:
   a1) deposition of a layer based on sacrificial material on the substrate and covering at least the microelectronic device,
   a2) formatting of a part of the sacrificial layer, a remaining portion of the sacrificial layer forming said portion of sacrificial material.

3. The method according to claim 1, further comprising, between step a) of formation of the portion of sacrificial material and step b) of deposition of the getter material layer, a step of thermal flow of the portion of sacrificial material.

4. The method according to claim 1, further comprising, between step a) of formation of the portion of sacrificial material and step b) of deposition of the getter material layer, a step of deposition of a protective layer on the portion of sacrificial material, the getter material layer being deposited, during step b), on the protective layer, the orifice being moreover formed, during step c), through the protective layer.

5. The method according to claim 4, wherein the protective layer has a thickness between around 10 nm and 1 μm.

6. The method according to claim 1, wherein the first hermeticity layer has a thickness between around 500 nm and 10 μm.

7. The method according to claim 1, further comprising, between step b) of deposition of the getter material layer and step c) of formation of the orifice, a step of etching a part of the layer or layers formed on the portion of sacrificial material, the remaining portions of said deposited layer(s) forming a cover or a part of the first cover covering the portion of sacrificial material.

8. The method according to claim 1, wherein step e) of sealing comprises the deposition of a layer of a material and/or the formation of at least one plug, obstructing the orifice on the first cover.

9. The method according to claim 8, wherein the material and/or the plug obstructing the orifice are based on a metal and/or an oxide and/or a getter material.

10. The method according to claim 1, further comprising, during step a) of formation of the portion of sacrificial material, formation of at least one second orifice in the portion of sacrificial material, the layers deposited during subsequent steps also being deposited in said second orifice, forming at least one micro-pillar in the cavity.

11. The method according to claim 1, wherein the portion of sacrificial material has a thickness between around 1 μm and 20 μm.

12. The method according to claim 1, wherein the getter material layer has a thickness between around 200 nm and 5 μm.

13. The method according to claim 1, further comprising, after step e) of sealing of the cavity, a step of thermal activation of the getter material.

14. The method according to claim 1, further comprising, between step c) of formation of the orifice and step d) of elimination, or between step d) of elimination and step e) of sealing, the following steps:
   formation of a second portion of sacrificial material on the getter material layer or on the first hermeticity layer, the volume of which occupies a space intended to form at least one part of a second cavity,
   deposition of a second layer based on at least one getter material and/or a second hermeticity layer covering at least one part of the second portion of sacrificial material,
   formation of at least one second orifice through at least the second layer of getter material and/or the second hermeticity layer, forming an access to the second portion of sacrificial material;
   and further comprising, between the step of formation of the second orifice and step d) of elimination, or during step d) of elimination, or between step d) of elimination and step e) of sealing, a step of elimination of at least the second portion of sacrificial material via the second orifice, forming the second cavity.

15. The method according to claim 14, further comprising, between the step of deposition of the second layer of getter material and/or the second hermeticity layer and the step of formation of the second orifice, etching a part of the layer or layers formed on the second portion of sacrificial material, the remaining portions of said deposited layer(s) forming a second cover or a part of a cover covering the second portion of sacrificial material.

16. The method according to claim 14, wherein step e) of sealing comprises the deposition of a layer of a material and/or the formation of at least one plug, obstructing the second orifice on the second layer of getter material and/or on the second hermeticity layer.

17. The method according to claim 4, wherein the protective layer has a thickness between around 10 nm and 1 μm and is based on any one of: chromium, copper, or a combination of chromium and copper.

18. The method according to claim 4, wherein the protective layer is based on any one of: chromium, copper, or a combination of chromium and copper.

19. The method according to claim 1, wherein the first hermeticity layer has a thickness between around 500 nm and 10 μm, and is based on any one of: titanium, chromium, copper, at least one metal, a material transparent to a range of operating wavelengths of the microelectronic device, or any combinations thereof.

20. The method according to claim 1, wherein the first hermeticity layer is based on any one of: titanium, chromium, copper, at least one metal, a material transparent to a range of operating wavelengths of the microelectronic device, or any combinations thereof.

21. The method according to claim 1, wherein the portion of sacrificial material has a thickness between around 1 μm and 20 μm, and the sacrificial material is based on photosensitive resin or at least one metal.

22. The method according to claim 1, wherein the portion of sacrificial material is based on photosensitive resin or at least one metal.

23. The method according to claim 1, wherein the getter material layer has a thickness between around 200 nm and 5 μm, and is based on any one of: titanium, zirconium, vanadium, or any combinations thereof.

24. The method according to claim 1, wherein the getter material layer is based on any one of: titanium, zirconium, vanadium, or any combinations thereof.

25. The method according to claim 14, wherein the second hermeticity layer has a thickness between around 500 nm and 10 μm, and is based on any one of: titanium, chromium, copper, at least one metal, a material transparent to a range of operating wavelengths of the microelectronic device, or any combinations thereof.

26. The method according to claim 14, wherein the second hermeticity layer is based on any one of: titanium, chromium, copper, at least one metal, a material transparent to a range of operating wavelengths of the microelectronic device, or any combinations thereof.

* * * * *